(12) United States Patent
Tseng (10) Patent No.: US 7,161,192 B2
(45) Date of Patent: Jan. 9, 2007

(54) SILICON CONTROLLED RECTIFIER (75) Inventor: Jen-Chou Tseng, Hsinchu County (TW)

(73) Assignee: Winbond Electronics Corp., Hsinchu (TW)

( * ) Notice: Subject to any disclaimer, the term of this patent is extended or adjusted under 35 U.S.C. 154(b) by 314 days.

(21) Appl. No.: 10/711,542

(22) Filed: Sep. 24, 2004

(65) Prior Publication Data
US 2005/0224836 A1 Oct. 13, 2005

(30) Foreign Application Priority Data
Apr. 5, 2004 (TW) .............................. 93109340 A (51) Int. Cl.
*H01L 29/74* (2006.01)
(52) U.S. Cl. .................. 257/173; 257/162; 257/168; 257/170
(58) Field of Classification Search ........ 257/109–112, 257/139, 141, 162, 168, 170, 173
See application file for complete search history.

(56) References Cited

U.S. PATENT DOCUMENTS

| | | | |
|---|---|---|---|
| 5,856,214 A * | 1/1999 | Yu .............................. 438/133 |
| 6,091,593 A * | 7/2000 | Lin .............................. 361/111 |
| 6,281,527 B1* | 8/2001 | Chen ........................... 257/168 |
| 6,521,952 B1* | 2/2003 | Ker et al. ..................... 257/360 |
| 6,538,288 B1* | 3/2003 | Lee et al. ..................... 257/355 |
| 6,646,840 B1* | 11/2003 | Sugerman et al. ............. 361/56 |
| 7,034,363 B1* | 4/2006 | Chen ........................... 257/355 |
| 2003/0052329 A1* | 3/2003 | Kobayashi et al. .......... 257/135 |

* cited by examiner

*Primary Examiner*—N. Drew Richards
(74) *Attorney, Agent, or Firm*—Jianq Chyun IP Office (57) ABSTRACT

A silicon controlled rectifier is provided, including: a first conducting-type substrate; two second conducting-type deep wells separately disposed inside the first conducting-type substrate; a gate above the first conducting-type substrate and between the two second conducting-type deep wells; a first source/drain inside one of the two second conducting-type deep wells and at one side of the gate; a second source/drain inside the other of the two second conducting-type deep wells and at the other side of the gate; a first conducting-type doped region inside the first conducting-type substrate; and a first conducting-type doped floating region inside the one of the two second conducting-type deep wells and adjacent to the first source/drain. The first conducting-type doped floating region and the first source/drain constitute an equivalent Zener diode so that the modified silicon controlled rectifier can have a higher holding voltage.

10 Claims, 6 Drawing Sheets

SILICON CONTROLLED RECTIFIER

CROSS-REFERENCE TO RELATED APPLICATION

This application claims the priority benefit of Taiwan application serial no. 93109340, filed on Apr. 5, 2004.

BACKGROUND OF THE INVENTION

1. Field of the Invention

This invention generally relates to a semiconductor device, and more particularly to a silicon controlled rectifier (SCR) for electrostatic discharge (ESD) protection.

2. Description of Related Art

ESD occurs due to the movement of electrostatic charges on a non-conductor, which causes the damage of the semiconductor devices and other circuits in the IC. For example, when the relative humidity is higher, several hundred or thousand Volts of electrostatic voltage will be detected on a human body walking on the carpet. When the relative humidity is lower, more than ten thousand Volts of electrostatic voltage will be detected on a human body. Likewise, several hundred or thousand Volts of electrostatic voltage will be detected on an equipment for packing or testing the IC due to the humidity or other factors. When the subjects with electrostatic charges contact the chips, the subjects will discharge the electrostatic charges toward the chips. The instant discharging power may seriously damage the circuits in the chips.

Figure 1:
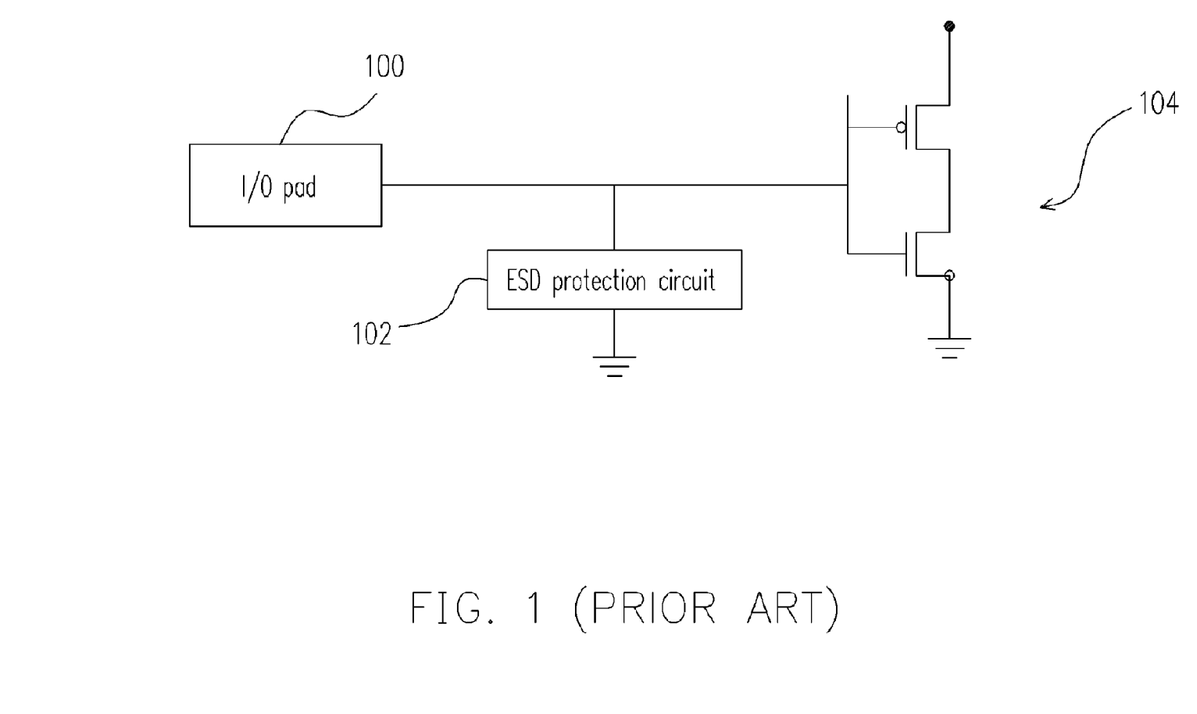
FIG. 1 is a block diagram of a traditional ESD protection device.

Therefore, to prevent the ESD from damaging the circuits in the chips, several ESD protection devices are proposed. FIG. 1 is a block diagram of a traditional ESD protection device. Referring to FIG. 1, the prior art provides an ESD protection circuit 102 on the I/O pad 100 of the chip as the discharging path to prevent the circuit from being damaged. In a normal condition, the circuit in FIG. 1 works as if the ESD protection circuit 102 does not exist so that the I/O pad is directly coupled to the internal circuit 104. When a high voltage pulse (i.e., the voltage generated due to electrostatic discharge) occurs, the ESD protection circuit 102 can prevent the current from I/O pad from entering into the internal circuit 104 in order to protect the internal circuit 104.

Figure 2:
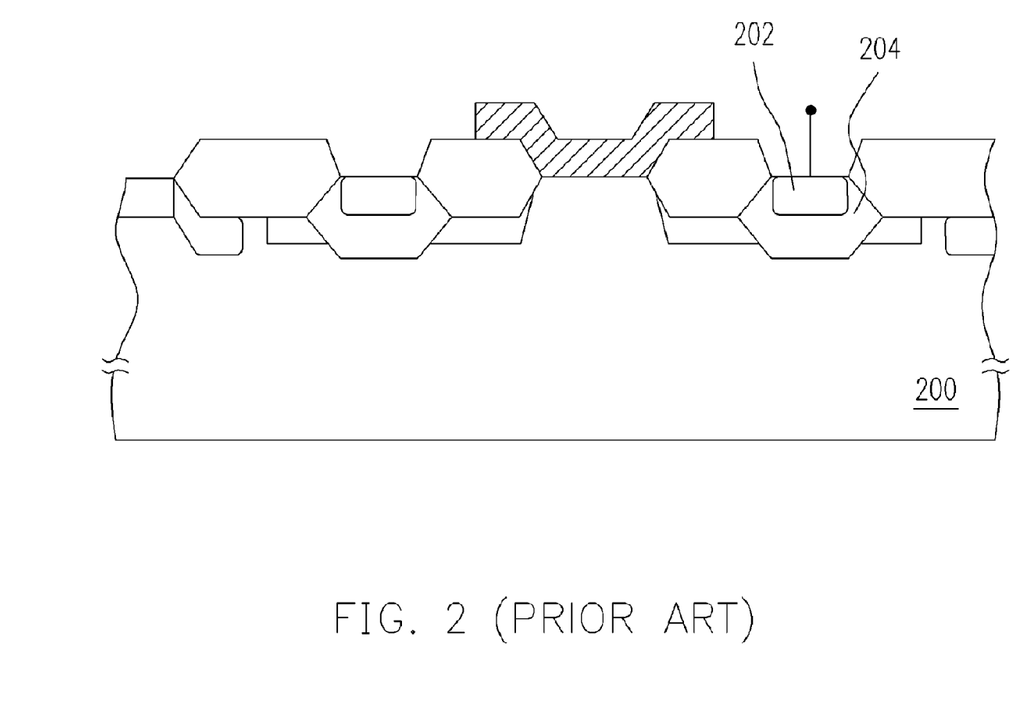
FIG. 2 is a cross-sectional view of a HVNMOS transistor.
Figure 3:
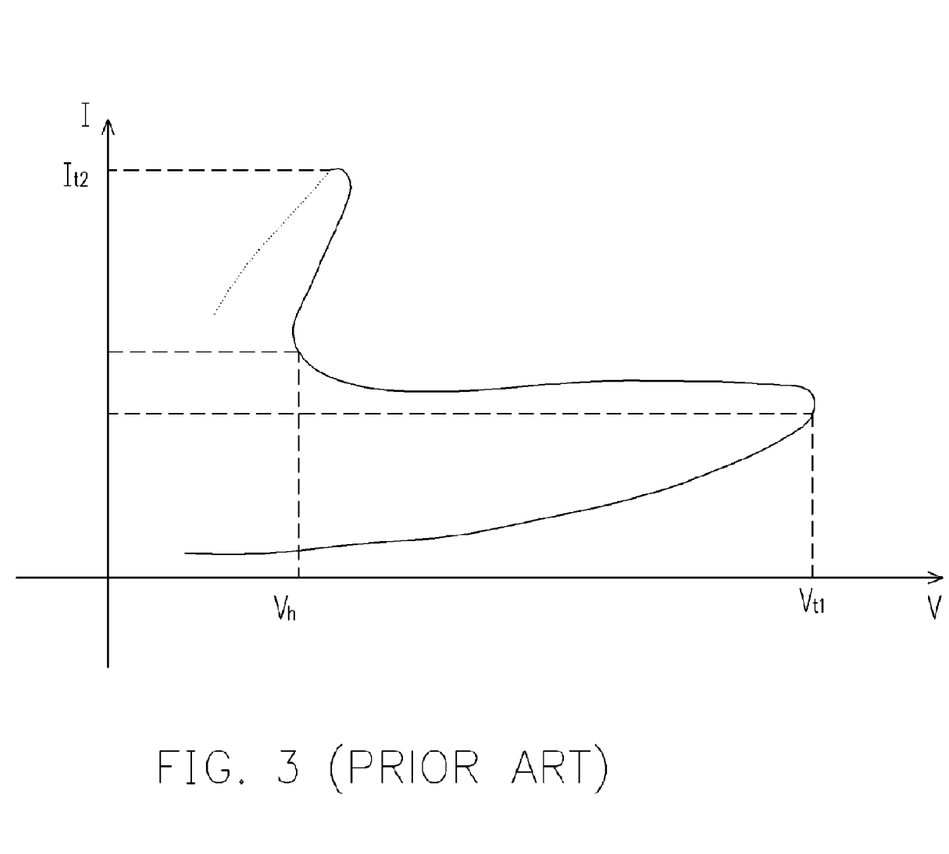
FIG. 3 is an ideal voltage-current characteristic curve of the HVNMOS transistor.

In the prior art, the metal oxide semiconductor (MOS) transistor is used as the ESD protection device. FIG. 2 is a cross-sectional view of a high voltage NMOS (HVNMOS) transistor. FIG. 3 is an ideal voltage-current characteristic curve of a HVNMOS transistor. Referring to FIGS. 2 and 3, when the drain 202 is applied with an increasing ESD voltage, the current of the HVNMOS transistor will slowly increase as the increasing ESD voltage. When the ESD voltage reaches the triggering voltage Vt1, the junction of the P substrate 200 and the N-deep well will break down. In the meantime, the current increases rapidly and the voltage decreases as the current increases. When the voltage of the HVNMOS reaches the holding voltage Vh, even if the current increases quickly, the voltage maintains at the same level (or increases very slowly).

However, when the voltage applied to a typical HVNMOS transistor is higher than the triggering voltage Vt1, the reverse-biased drain-substrate junction goes into avalanche breakdown, because the largest tolerable forward current It2 of the HVNMOS transistor can tolerate is too small, the second junction breakdown would occur in a very short time. The HVNMOS transistor thereby cannot snap back and fails immediately to generate leakage current. Consequently, the HVNMOS transistor becomes ineffective. In light of the above, the HVNMOS transistor alone cannot be the ESD protection device.

Figure 4:
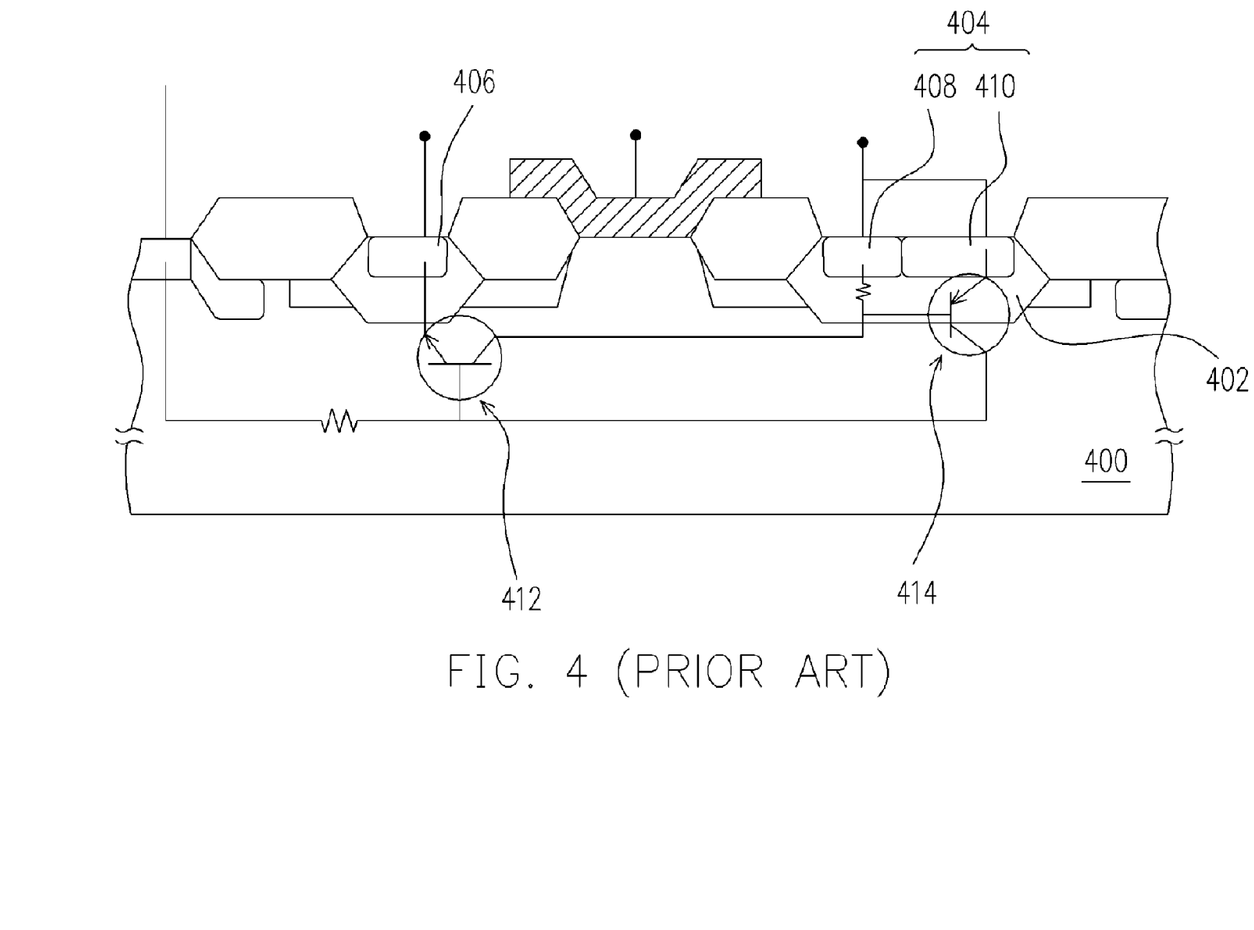
FIG. 4 shows a cross-sectional view of a HVNMOS transistor with an embedded SCR and the equivalent circuit thereof.

To provide the HVNMOS transistor with the ESD protection device, an embedded SCR is formed in the HVNMOS transistor to increase the largest tolerable ESD current of the HVNMOS transistor according to the prior art. As a result, the tolerance of the HVNMOS transistor to the ESD is enhanced. FIG. 4 shows the cross-sectional view of the HVNMOS transistor with an embedded SCR and the equivalent circuit thereof. Referring to FIG. 4, the P-doped region 410 and N-doped region 408 constitute the drain 404. The P-doped region 410, the N deep well 402, and the P substrate 400 form a PNP BJT 414; the N deep well 402, the P substrate 400, and the source 406 form a NPN BJT 412.

The collectors of the PNP BJT and the NPN BJT are coupled to the bases of the other BJTs to form a P-N-P-N semiconductor device with three junctions. This parasitic device with the P-N-P-N junction is so-called embedded SCR, which can enhance the tolerance of the transistor to the ESD.

SUMMARY OF THE INVENTION

An object of the present invention is to provide a modified SCR to tolerate a larger ESD current in order to effectively protect the integrated circuit from being damaged by the ESD.

The present invention provides a modified silicon controlled rectifier comprising: a first conducting-type substrate; two second conducting-type deep wells separately disposed inside the first conducting-type substrate; a gate above the first conducting-type substrate and between the two second conducting-type deep wells; a first source/drain inside one of the two second conducting-type deep wells and at one side of the gate; a second source/drain inside the other of the two second conducting-type deep wells and at the other side of the gate; a first conducting-type doped region inside the first conducting-type substrate; and a first conducting-type doped floating region inside the one of the two second conducting-type deep wells and adjacent to the first source/drain, the first conducting-type doped floating region being floating when driving the modified silicon controlled rectifier.

In an embodiment of the present invention, the first conducting-type doped floating region is a P-type doped floating region, the two second conducting-type deep wells are N deep wells, and the first source/drain and the second source/drain are N-doped sources/drains. In another embodiment of the present invention, the first conducting-type doped floating region is an N-type doped floating region, the two second conducting-type deep wells are P deep wells, and the first source/drain and the second source/drain are P-doped sources/drains.

In an embodiment of the present invention, the first conducting-type substrate is a P substrate and the first conducting-type doped region is a P-type doped region. In another embodiment of the present invention, the first conducting-type substrate is an N type substrate the first conducting-type doped region is an N-type doped region.

In an embodiment of the present invention, the modified silicon controlled rectifier further comprises a plurality of isolation structures between the two second conducting-type deep wells, the gate, and the first conducting-type doped region.

In an embodiment of the present invention, the modified silicon controlled rectifier further comprises a plurality of second conducting-type doped extension regions inside the first conducting-type substrate and adjacent to the two second conducting-type deep wells. In an embodiment of the present invention, the plurality of second conducting-type doped extension regions is N-type doped extension regions. In another embodiment of the present invention, the plurality of second conducting-type doped extension regions is P-type doped extension regions.

In an embodiment of the present invention, the modified silicon controlled rectifier further comprises a plurality of first conducting-type doped extension regions inside the first conducting-type substrate and adjacent to the first conducting-type doped region. In an embodiment of the present invention, the plurality of first conducting-type doped extension regions are P-type doped extension regions. In another embodiment of the present invention, the plurality of first conducting-type doped extension regions is N-type doped extension regions.

The modified SCR of the present invention has a larger holding voltage than the embedded SCR and the tolerable ESD voltage of the modified SCR of the present invention is much higher than that of HVNMOS transistor. Hence, the present invention can enhance the tolerance of the modified SCR to the ESD and the latch-up effect.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

DESCRIPTION OF THE PREFERRED EMBODIMENTS

The present invention discloses a modified silicon controlled rectifier (SCR) with a higher tolerance to voltage/current in order to serve as an ESD protection device. The embodiments described below are for the demonstration of the present invention, and do not intend to limit to the scope of the present invention. In the first embodiment, the first conducting type is the P-type and the second conducting type is the N-type. One skilled in the art can change the first conducting type to the N-type and the second conducting type to the P-type, which will be illustrated in the second embodiment.

Figure 5:
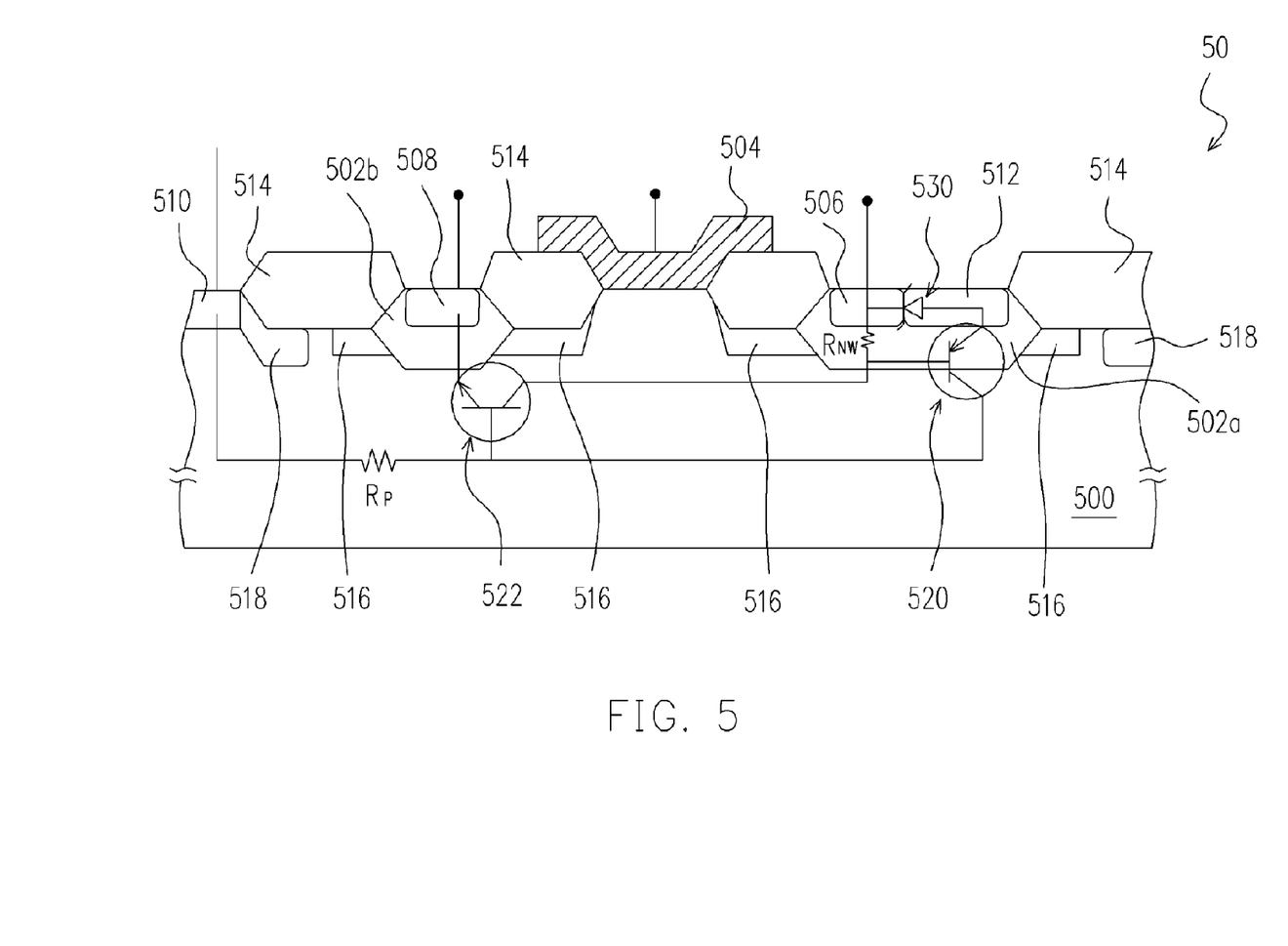
FIG. 5 shows a cross-sectional view of a modified SCR and the equivalent circuit thereof in accordance with an embodiment of the present invention.

FIG. 5 shows the cross-sectional view of a modified SCR and the equivalent circuit thereof in accordance with an embodiment of the present invention. This modified SCR 50 is formed by a NMOS transistor, comprising a P substrate 500, a N deep well 502a, a N deep well 502b, a gate 504, a drain 506, a source 508, a P-doped region 510, and a P-type doped floating region 512. The N deep well 502a and N deep well 502b separately are disposed inside the P substrate 500. The gate is disposed above the P substrate 500 and is between the N deep well 502a and N deep well 502b.

The drain 506 and source 508 are N-doped materials and are respectively disposed on the surfaces of the N deep well 502a and N deep well 502b. The P-doped region 510 is on the surface of the P substrate 500. The P-type doped floating region 512 is adjacent to the drain 506 and is disposed inside the N deep well 512a. Especially, the P-type doped floating region 512 is in contact with the drain 506.

The process for forming the gate 504, the drain 506, and the source 508 of this embodiment is similar to the process for forming an ordinary MOS transistor, and thus will not be further described herein. The process for forming the N deep well 502a, N deep well 502b, the P-doped region 510 and the P-type doped floating region is also similar to the process for forming the doped region of a semiconductor device; for example, one can use ion implantation to implant N-type or P-type dopants into the P substrate 500.

In addition, in this embodiment, there is an isolation structure 514 between the N deep wells 502a/502b, the gate 504, and the P-doped region 510 for preventing the oxide layer between the N deep wells 502a/502b and the gate 504 from breaking down and thus preventing the modified SCR from being ineffective. The isolation structure 514 is formed by the local oxidation (LOCOS).

In addition, the N-doped extension region 516 is disposed in the P substrate 500 on the two sides of the N deep wells 502a/502b. The P-doped extension region 518 is disposed in the P substrate 500 on the two sides of the P-doped region 510. The N-doped extension region 516 and the P-doped extension region 518 are below the isolation structure 514. The N-doped extension region 516 and the P-doped extension region 518 are formed by the ion implantation.

According to the equivalent circuit in FIG. 5, the P-type doped floating region 512, the N deep well 502a and the P substrate 500 constitute a PNP BJT 520. RNW is the resistance of the N deep well 502a. The P-type doped floating region 512 is the emitter of the PNP BJT 520; the N deep well 502a is the base of the PNP BJT 520; the P substrate 500 is the collector of the PNP BJT 520.

On the other hand, the N deep well 502a, the P substrate 500, and the N deep well 502b form a NPN BJT 522. RP is the resistance of the P substrate 500. The N deep well 502a is the collector of the NPN BJT 522; the P substrate is the base of the NPN BJT 522; the N deep well 502b is the emitter of the NPN BJT 522. For example, the collector of the PNP BJT 520 is coupled to the base of the NPN BJT 522, and the base of the PNP BJT 520 is coupled to the collector of the NPN BJT 522, thereby forming a modified SCR with the gate 504, the drain 506, and the source 508.

When using the modified SCR of this embodiment as the ESD protection device, the current due to the ESD will enter the drain 506 and generate a voltage difference between the N deep well 502a and the P substrate 500. If the voltage difference is higher than the breakdown voltage of the junction, this junction will break down and generate hole current which can forward bias the base-emitter junction between P substrate 500 and the N deep well 502b thus the NPN BJT 522 is turned on. On the other hand, electron current can forward bias the base-emitter junction between the N deep well 502a and the P-type doped floating region 512 then the PNP BJT 520 is turned on, too. Once the $\beta_{npn}*\beta_{pnp} \geq 1$, the modified SCR will stay latched and vent a large scale ESD current.

It should be noted that the drain 506 is directly contacted with the P-type doped floating region 512 to increase the electric field across junction and results in a tunneling effect between the drain 506 and the P-type doped floating region 512, the electrons will pass through the P-type doped floating region 512 to the drain 506 having N-type dopants. Hence, the drain 506 and the p-type doped floating region can be considered as a Zener diode 530. This equivalent Zener diode 530 is used to increase the holding voltage of the modified SCR to prevent the high noise voltage from the external circuit from causing the latch-up on the modified SCR.

It should be noted that the breakdown voltage of the equivalent Zener diode 530 constituted by the drain 506 and the P-type doped floating region 512 will present due to the tunneling effect. Hence, the holding voltage (Vh in FIG. 3) of the modified SCR will increase. In addition, based on the experimental data, the tolerable ESD voltage of the modified SCR of the present invention is increased to 3000V, compared to 500V of the HVNMOS transistor. Accordingly, the modified SCR of this embodiment can tolerate higher voltage and is more suitable than the HVNMOS transistor as the ESD protection device.

Figure 6:
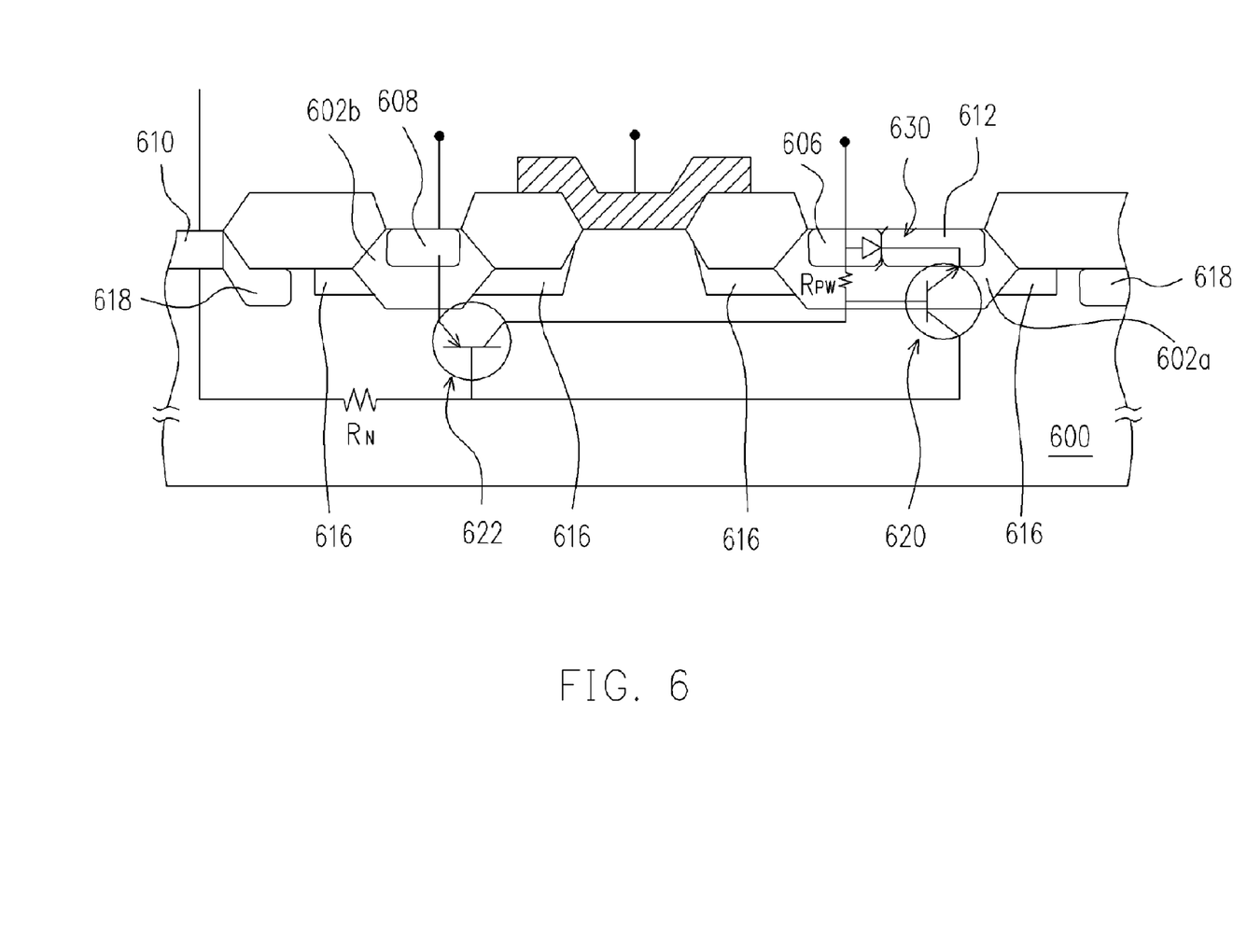
FIG. 6 shows across-sectional view of a modified SCR and the equivalent circuit thereof in accordance with another embodiment of the present invention.

In addition, the present invention can use the HVPMOS transistor to form the modified SCR. FIG. 6 shows a cross-sectional view of the modified SCR and the equivalent circuit thereof in accordance with another embodiment of the present invention. In this embodiment, the P-type device in the first embodiment is replaced with the N-type device, and the N-type device in the first embodiment is replaced with the P-type device. The process for forming the devices is similar to the first embodiment and will not be repeated herein.

According to the equivalent circuit in FIG. 6, the N-type doped floating region 612, the P deep well 602a and the N substrate 600 form a NPN BJT 620. RN is the resistance of the N substrate 600. The N-type doped floating region 612 is the emitter of the NPN BJT 620; the P deep well 602a is the base of the NPN BJT 620; the N substrate 600 is the collector of the NPN BJT 620.

On the other hand, the P deep well 602a, the N substrate 600, and the P deep well 602b form a PNP BJT 622. RPW is the resistance of the P deep well 602a. The P deep well 602a is the collector of the PNP BJT 622; the N substrate 600 is the base of the PNP BJT 622; the P deep well 602b is the emitter of the PNP BJT 622. I.e., the collector of the NPN BJT 620 is coupled to the base of the PNP BJT 622, and the base of the NPN BJT 620 is coupled to the collector of the PNP BJT 622, thereby forming a modified SCR with the gate 604, the drain 606, and the source 608. Especially, the drain 606 and the N-type doped floating region 612 constitute an equivalent Zener diode 630.

Like the first embodiment, the breakdown voltage of the equivalent Zener diode 630 constituted by the drain 606 and the P-type doped floating region 612 presents due to the tunneling effect. Hence, the holding voltage (Vh in FIG. 3) of the modified SCR also increases. In addition, based on the experimental data, the holding voltage of the modified SCR is 10.89V, compared to 4~5V of the embedded SCR. Further, based on the experimental data, the tolerable ESD voltage of the modified SCR of the present invention is increased to 8000V, compared to 500V of the HVPMOS transistor. Hence, it shows that the modified SCR of this embodiment can tolerate higher voltage and is more suitable than the HVPMOS transistor to be the ESD protection device.

In light of the above, the present invention disposes a conducting doped floating region besides the drain of the MOS transistor so that the drain and the conducting doped floating region constitute an equivalent Zener diode. By using the Zener diode, the holding voltage of the modified SCR is increased. Because the modified SCR of the present invention has a higher holding voltage, the high noise voltage from the external circuit from causing the latch-up on the modified SCR is prevented. Hence, the modified SCR of the present invention has a higher holding voltage than the traditional embedded SCR; the modified SCR of the present invention also has a much higher tolerable ESD voltage than the HVMOS transistor.

Therefore, the modified SCR of the present invention not only has higher tolerance to the ESD and the latch-up, but also can provide a self-protection mechanism to prevent itself from damage due to the ESD. Hence, the modified SCR of the present invention can more effectively protect the integrated circuit from the ESD damage.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A silicon controlled rectifier comprising:
a first conducting-type substrate;
two second conducting-type deep wells separately disposed inside said first conducting-type substrate;
a gate above said first conducting-type substrate and between said two second conducting-type deep wells;
a first source/drain inside one of said two second conducting-type deep wells and at one side of said gate;
a second source/drain inside the other of said two second conducting-type deep wells and at another side of said gate;
a first conducting-type doped region inside said first conducting-type substrate; and
a first conducting-type doped floating region inside said one of said two second conducting-type deep wells and adjacent to said first source/drain, said first conducting-type doped floating region being floating when driving said silicon controlled rectifier.

2. The silicon controlled rectifier of claim 1, wherein said first conducting-type doped floating region is a P-type doped floating region, said two second conducting-type deep wells are N deep wells, said first conducting-type substrate is a P substrate, said first conducting-type doped region is a P-type doped region, and said first source/drain and said second source/drain are N-doped sources/drains.

3. The silicon controlled rectifier of claim 1, wherein said first conducting-type doped floating region is a N-type doped floating region, said two second conducting-type deep wells are P deep wells, said first conducting-type substrate is a N substrate, said first conducting-type doped region is a N-type doped region, and said first source/drain and said second source/drain are P-doped sources/drains.

4. The silicon controlled rectifier of claim 1, further comprising a plurality of isolation structures between said two second conducting-type deep wells, said gate, and said first conducting-type doped region.

5. The silicon controlled rectifier of claim 1, further comprising a plurality of second conducting-type doped extension regions inside said first conducting-type substrate and adjacent to said two second conducting-type deep wells.

6. The silicon controlled rectifier of claim 5, wherein said plurality of second conducting-type doped extension regions is N-type doped extension regions.

7. The silicon controlled rectifier of claim 5, wherein said plurality of second conducting-type doped extension regions is P-type doped extension regions.

8. The silicon controlled rectifier of claim 1, further comprising a plurality of first conducting-type doped extension regions inside said first conducting-type substrate and adjacent to said first conducting-type doped region.

9. The silicon controlled rectifier of claim 8, wherein said plurality of first conducting-type doped extension regions is N-type doped extension regions.

10. The silicon controlled rectifier of claim 8, wherein said plurality of first conducting-type doped extension regions is P-type doped extension regions.

* * * * *